United States Patent [19]

Klein

[11] 4,177,553

[45] Dec. 11, 1979

[54] REINFORCED FLEXIBLE PRINTED WIRING BOARD

[75] Inventor: Theodore H. Klein, Livingston, N.J.

[73] Assignee: Bell Telephone Laboratories, Incorporated, Murray Hill, N.J.

[21] Appl. No.: 881,706

[22] Filed: Feb. 27, 1978

Related U.S. Application Data

[62] Division of Ser. No. 701,591, Jul. 1, 1976, Pat. No. 4,103,102.

[51] Int. Cl.² .............................................. H05K 3/10
[52] U.S. Cl. ...................................... 29/625; 156/148
[58] Field of Search ...................... 29/625; 57/140 G; 156/148; 427/96, 401, 407 B; 428/259, 228, 273

[56] References Cited

U.S. PATENT DOCUMENTS

| | | | |
|---|---|---|---|
| 2,448,782 | 9/1948 | Davis | 428/273 |
| 2,729,933 | 1/1956 | Crawford | 57/140 G |
| 3,010,848 | 11/1961 | Rochas et al. | 427/407 B X |
| 3,940,534 | 2/1976 | Fick et al. | 428/228 |
| 3,955,024 | 5/1976 | Goldman et al. | 428/273 |
| 4,066,106 | 1/1978 | Graham | 428/273 |
| 4,115,185 | 9/1978 | Carlson | 156/659 |

*Primary Examiner*—Francis S. Husar
*Assistant Examiner*—C. J. Arbes
*Attorney, Agent, or Firm*—Peter V. D. Wilde; Samuel H. Dworetsky

[57] ABSTRACT

An improved reinforced flexible printed wiring board is disclosed. The reinforcement in this printed wiring board is composed of a fabric woven from a yarn of plied continuous filaments of polyester and glass. The fabric is impregnated with an appropriate resin which is subsequently cured. This printed wiring board is found to have improved mechanical and thermal characteristics with little degradation in electrical properties.

7 Claims, 2 Drawing Figures

REINFORCED FLEXIBLE PRINTED WIRING BOARD

This is a division of application Ser. No. 701,591 filed July 1, 1976, now U.S. Pat. No. 4,103,102.

BACKGROUND OF THE INVENTION

1. Field of the Invention

This invention is an improved flexible printed wiring board.

2. Description of the Prior Art

Over the past 25 years reinforced resins have been used in an ever-widening range of applications. Such materials are used in construction as a substitute for various structural materials, in electronics as printed wiring board, and in diverse recreational fields. The requirements of each application dictate the use of specific reinforcement materials as well as the use of carefully engineered resins. Reinforcement materials include polyester or glass fibers woven into a fabric or used as a nonwoven mat. The resins are usually organic polymers such as polyesters, polybutadienes or epoxies. Depending upon the particular resin, curing may be effected by means of either conventional heating, or exposure to u.v. light or energetic electrons. The fabrication process is also tailored to the specific product being produced. Such processes include wet-layup techniques, matched metal mold processes, vacuum-bag techniques or the more sophisticated pultrusion process.

A particularly successful application of reinforced materials involves their use in rigid printed wiring board. A specific single step technique for producing copper clad rigid printed wiring board involves the pultrusion process and is disclosed in a commonly assigned application Ser. No. 594,580.

Printed wiring board may have a wide range of mechnical flexibility depending upon the particular application envisioned. In certain applications, thin printed wiring board with a high degree of flexibility is required. For example, the circuitry required in certain telephone handsets is most easily included within the handset by means of a suitable flexible printed wiring board. Such printed wiring board must have sufficient flexibility and mechanical integrity to fit within the handset and to conform to its contours. In addition, it must be sufficiently tough to survive exposure to soldering and various punching, drawing, and power screwing operations encountered during assembly. In general, flexible printed wiring board (FPW) must have both high initiation and propagation tear strength, good dimensional and thermal stability as well as low moisture absorption and good electrical insulation properties.

There are two broad categories into which most flexible printed wiring boards fall—supported wiring board and unsupported wiring board. The supported board, unlike the unsupported board, has some type of reinforcement for added strength. Glass or polyester fibers are the two most common materials used as reinforcement in supported printed wiring boards. Mylar and kapton films are two examples of unsupported printed wiring board.

Attempts to improve the mechanical characteristics of flexible printed wiring board while maintaining its electrical characteristics have met with only limited success. In the unsupported FPW class, mylar is found to melt at the soldering temperatures which must be reached to solder the various circuit components to the board. Kapton has high moisture absorption which has a deleterious effect on dimensional stability. In addition, it displays a propensity to blister on exposure to molten solder. It also has an undesirably low propagation tear strength (i.e., less than 8 gms/mil of thickness), although it has adequate initiation tear strength. FPW reinforced with glass fibers has adequate dimensional and thermal stability, but has low propagation tear strength and also tends to crack on sharp bending. Polyester fiber reinforced boards generally have less thermal stability and higher moisture absorption than fiberglass reinforced FPW but such polyester reinforced boards have higher tear strength. Attempts to use combinations of reinforced materials, in triply or short fiber mat configurations, have met with only limited success.

SUMMARY OF THE INVENTION

This invention is an improved reinforced flexible printed wiring board. The reinforcement in this flexible printed wiring board consists of a fabric woven from yarn comprising continuous filaments of polyester and glass fiber plied together. The yarn is subsequently woven into a fabric which is impregnated or coated with an appropriate resin, and a circuit is then defined on the resin impregnated fabric. Such flexible printed wiring board is found to have the desirable characteristics associated with both the polyester and glass reinforcements but not some of the drawbacks normally associated with these individual materials.

DETAILED DESCRIPTION

Figure 1:
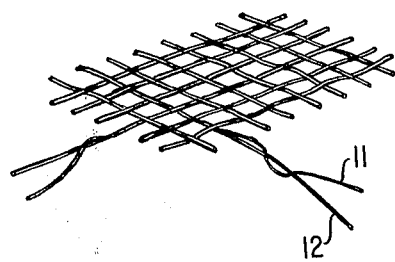
FIG. 1 represents the reinforcement material used in this invention.

Prior to this invention, the vast majority of reinforced flexible printed wiring board used either woven or nonwoven glass or polyester reinforcement. When glass is used as a woven reinforcement, the strands must be coated with a lubricant prior to processing in order to prevent abrading and breaking during the subsequent processing steps, such as weaving. The term "lubricant" encompasses a wide range of protective and antiabrasion coatings—including but not limited to binders and sizings—which must be applied to the glass in view of its very delicate nature in the pristine state. The lubricant tends to interfere with the adherence of any subsequently-deposited resin and, consequently, should be removed prior to the resin application step. The removal process generally involves heating the woven glass to a temperature of approximately 600 degrees F. for approximately 24 hours. Such a temperature has little significant effect on the glass reinforcement and consequently may be tolerated. Once the lubricant is removed, the resin may be applied to the woven glass reinforcement and cured to yield the requisite flexible reinforced resin. Either before or after complete curing, an appropriate circuit may be defined on the reinforced material. It may be desirable to include a coupling agent in the resin so that it will more effectively adhere to the fiberglass. Such coupling agents, applied directly to the glass or included in the resin, are less effective if the organic lubricant, necessary during the weaving step, is not first completely removed. The glass-resin bond-strength requirements provide the motivation for removing the lubricant prior to application of the resin.

Although printed wiring boards which use fiberglass fabric as a reinforcement have generally acceptable characteristics, the relatively low propagation tear strength of the fiberglass is a serious drawback. On the other hand, polyester reinforcement, which has higher propagation tear strength, is found to have low thermal stability and high moisture absorption. While a mixture of polyester and glass might initially be considered, such a mixture is apparently undesirable because the relatively low melting temperature of the polyester would not permit complete removal of the lubricant from the glass after the weaving process. Heating the fabric to remove the lubricant would be effective, but would destroy the polyester, which would form an integral part of such a mixed fabric. Mixed polyester fiberglass reinforcement might, however, be used in other applications where the glass-resin adherence requirements are not as stringent as those necessary in printed wiring board. When the resin adherence requirement is low, the lubricant may be incompletely removed or left on the fiberglass and the resultant reduced resin adherence presents little difficulty. However, such was not thought to be the case if the resin-fiber bond is critical. It had been thought that such critical bond requirements dictate complete removal of the lubricant, which is difficult in the mixed fabric.

Applicant has found, however, that when the ratio of the polyester-to-glass total surface area is greater than 1/10, the adherence of the resin to the polyester adequately compensates for the reduced resin adherence to the glass, on which significant amounts of the lubricant may remain. The fabrication specifications result in the desired thermal, dimensional, electrical, and tear strength characteristics required in flexible printed wiring board.

The parameters of the mixed reinforcement material disclosed in this invention are determined in part by the need to balance the advantages of the first material against the disadvantages of the second material, and vice versa. Glass fibers have good dimensional stability and thermal properties but have poor propagation tear strength. In addition, the lubricant required on the glass during weaving interferes with the resin adhesion but cannot be completely removed after the fabric is woven. The polyester, on the other hand, has high tear strength and good resin adherence qualities but has limited dimensional and thermal stability.

An element in this invention is the combination of polyester and fiberglass filaments in a twisted or plied yarn. The strands must be sufficiently continuous and the twist must be of sufficient periodicity to result in the constraint of the polyester, with its poor dimensional properties, to those of the glass with which it is intertwined. Between 0.1 and 10 twists per inch is adequate for such constraint, although between 0.1 and 6 twists per inch are preferable. While the yarn may be fabricated from a single filament of polyester plied with a single filament of glass, usual embodiments will involve the use of multiple filaments of polyester and glass plied together. In such a case the glass and polyester weights usually do not differ by more than a factor of 5. Staple fibers, because of their short length—generally less than two inches—are clearly undesirable. In addition to the fact that staple fibers do not display sufficient contact between the polyester and the fiberglass necessary to increase the apparent dimensional and thermal stability of the polyester, such short fibers have a general tendency to protrude from the resin surface and act as locii for contaminents, thereby degrading the electrical properties of the board as well as its surface smoothness. Continuous fibers are generally greater than five inches in length and, for the application envisioned here, the fibers will generally be at least as long as the printed wiring board ultimately to be fabricated.

The glass fibers used in fabricating the yarn are coated with an appropriate lubricant to protect them during the various processing steps. The lubricant is typically composed of dextrinized starch gums, hydrogenated vegetable oil, nonionic emulsifying agents, catonic lubricants, gelatin and polyvinyl alcohol or combinations thereof.

The yarn is usually woven into a plain weave fabric as shown in FIG. 1. In this figure, 11 is a polyester filament and 12 is a glass filament. A weave such as that shown in FIG. 1 improves the fabric's ability to accept the resin and to become saturated with it. If the physical and mechanical requirements are identical in both the warp and fill directions, a balanced construction should be utilized. If the weave cannot be square, the tear strength may still be equalized in the two directions by utilizing different weight yarns in the warp and fill direction. In general, the weave should be close enough to yield a stable fabric and allow for resin impregnation.

Subsequent to weaving, the lubricant previously deposited on the fiberglass filament may be partially removed by washing in appropriate solutions. However, the fabric is not heated above 300 degrees F. since this will result in degradation of the polyester. Consequently, at least part of the lubricant may not be removed. Nevertheless, the resin impregnation step which follows results in significant resin adherence to the polyester, which adherence is adequate to yield the desired properties. If the minimum amount of lubricant necessary for weaving is applied to the glass fiber then as much as 95 percent of the lubricant may be left on the fiber without preventing attainment of the specifications necessary in flexible printed wiring board and mentioned below. Currently, as much as 75 percent of the lubricant may be removed using removal processes which do not harm the polyester.

After the fabric is woven, it is impregnated or coated with resin using the techniques known in the art, the simplest of which involves guiding the fabric through a resin bath. The resin formulation is restricted only by effective performance of the resulting printed wiring board. Epoxy resins are most often used and may include various additives to improve flame retardance, resin adherence, flexibility and other properties. A specific resin formulation suited for flexible printed wiring board is disclosed in a commonly assigned application Ser. No. 690,735 filed May 27, 1976. The composition of this resin is given in Table I in parts by weight.

TABLE I

| Part A | | |
|---|---|---|
| | Composition | |
| | Range | Preferred |
| Epoxy Resin | 100.0 | 100.0 |
| Antimony Oxide | 0-80 | 55.4 ± 6.0 |
| Chlorinated Hydrocarbon Flame Retardant | 0-160 | 110.9 ± 11.0 |
| Part B | | |
| Maleic Anhydride Adduct of Methylcyclopentadiene | 68-95 | 86.7 ± 5.0 |

TABLE I-continued

| | | |
|---|---|---|
| Carboxy Terminated Butadiene-Acrylonitrile | 69–107 | 90.4 ± 3.0 |
| 2,4,6-Tri(dimethylaminomethyl) Phenol | 0.5–3.0 | 1.5 ± 0.5 |
| Antioxidant | 0.1–6.0 | 0.5 ± 3.0 |

The composition is essentially composed of an epoxy resin (Part A) and a hardener (Part B). The complete composition is referred to as the resin composition.

After the fabric is impregnated with resin a metallic circuit may be defined on the resin impregnated fabric thereby yielding a flexible printed wiring board. Two board classes of processes are available in the art for defining such a metallic circuit configuration. The first class of processes involves a subtractive technique in which a copper cladding is laminated onto the fabric. Appropriate areas of the cladding are then removed so that a suitable circuit configuration remains. The metallic cladding may be laminated onto the resin impregnated fiber either before or after total curing of the resin. The appropriate areas of the metallic cladding are defined most frequently by a photoprinting process, and the remaining areas of the metal are etched away.

A second broad circuit-defining technique is an additive process and involves sensitizing the fabric surface so that subsequent immersion of the fabric in a metallic solution results in selective metal deposition on the sensitized regions. Alternatively, in a hybrid additive process, a very thin metallic cladding may be deposited on the resin impregnated fabric with a pattern subsequently etched on this thin metallic layer. The limited thickness of the metal results in minimal metal loss during this subtractive portion of the process. Subsequent to this step, additional metal is selectedly deposited on the previously defined circuit configuration using, for example, electrolytic deposition.

Figure 2:
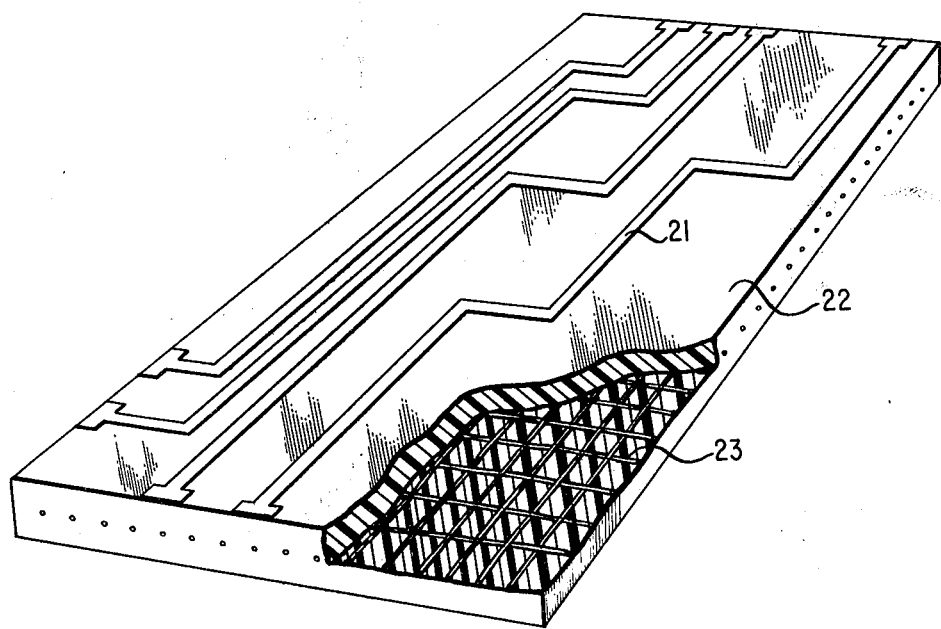
FIG. 2 is a schematic representation of a printed wiring board fabricated according to the dictates of this invention.

The completed printed wiring board is shown in FIG. 2 where 21 is the metallic circuit configuration, 22 is the at least partially cured resin, and 23 is the reinforcement. The flexible printed wiring board is usually between 0.3 and 20 mils thick while the metallic circuit defined on either one or both sides of the fabric, if copper, is 1.4 to 2.8 mils thick ("one to two ounce copper").

The various characteristics of the printed wiring board are in part dependent on the adherence of the resin to the underlying reinforcement. Despite what might have been expected to be a reduced resin-reinforcement bond due to the enforced retention of the lubricant on the glass fiber as discussed above, and as a result of the specific parameters of this invention, the applicant has found that the following specifications may be readily obtained.

The printed wiring board satisfies the flexibility requirements as normally stated in the art. In such a specification an approximately four-inch length of board is clamped onto two holding members separated by approximately one-quarter of an inch, each of which holding member is clamped to one end of the board and which holding members are laterally displaced from each other approximately 3.0 inches in a back and forth motion. The members may be translated back and forth at least 10 times with no failure in the associated circuit configuration. The resin must be one which upon curing will satisfy this flexibility requirement. Such a resin is referred to as a flexible resin. The 90 degree peel strength of the metallic circuit is greater than three pounds per inch of conductor width. The dimensional stability of the board in both the x and y direction after printed wire processing and exposure to 125 degrees C. for 48 hours is greater than 2 mils per inch. The insulation resistance of two isolated conducting elements of the circuit separated by 0.1 inch is greater than $1 \times 10^9$ ohms. The propagation tear strength of the board is greater than 0.5 lbs. The board components must be such as to satisfy these requirements.

To further improve the adherence of the resin to the fabric, various coupling agents may be utilized. These agents may be applied directly to the fabric prior to resin impregnation or, alternatively, they may be added to the resin prior to impregnation. Typical coupling agents include epoxy, silanes or amino vinyl silanes.

The techniques and procedures required in the practice of this invention are further indicated by the following example:

Example

In this example, a yarn of plied polyester and glass filament is fabricated using techniques well known in the art. The fibers are longer than 10 feet. The filaments are twisted about each other three times per inch. The fiberglass has a starch lubricant applied to it after the fiber forming process. The glass fibers are electrical grade glass, though other grade glasses may be used depending upon the nature of the particular requirements. In this example, the glass is 100 denier 204, and the polyester is 70 denier 34 Dacron ®, although fibers of other polyesters such as, for example, Kodel ®, Avlin ® or Encron ® may be used. Such approximately equal denier fibers are desirable though not absolutely necessary. Broad ranges of denier are possible as long as the ultimate printed wiring board meets the appropriate flexibility requirements.

The yarn is woven into a fabric with a thread count of 56×48. Thread counts from approximately 40 to approximately 60 threads per inch are, however, found to be adequate. The reinforcement fabric is usually within a thickness range of from 2 to 4 mils and weighs between 2.3 and 2.7 ounces/square yard. The fabric is a plain weave construction although other weaves satisfying the requirements of the printed wiring board are possible.

After the fabric is woven, approximately 30% of the lubricant is removed by washing in water at 150 degrees F. In this particular example, a coupling agent is applied to the fabric subsequent to washing, though it may be alternatively added to the final fabric rinse, the resin, or omitted entirely.

Various resin impregnation techniques well known in the art may be applied to the resultant fabric so as to yield the desired product. In this example, the fabric was impregnated with an epoxy resin. The resin is forced into the reinforcement and the resin-impregnated reinforcement then traverses a heating tower where the combination is B-staged to yield a prepreg. Simultaneously, a copper foil approximately 1.4 mils thick is coated with approximately 2 mils of resin. This resin-coated copper is then applied to the prepreg and heated at 300 degrees F. at 175 psi pressure by means of a heated nip roll to yield the final product. This copper clad composite is of approximately 9–10 mil overall thickness and is cut into the requisite size printed wiring board.

The fabrication techniques described above are well known in the art and are, consequently, described only in outline form. An element of the invention involves the nature of the fabric which forms the reinforcement for the flexible printed wiring board. Deviations and alternative embodiments which encompass this reinforcement are meant to be within the scope and spirit of this invention.

I claim:

1. A method of forming a reinforced flexible printed wiring board comprising:
   (a) coating a continuous glass fiber with a lubricant;
   (b) twisting relatively at least one continuous glass fiber about at least one continuous polyester fiber with a periodicity between 0.1 and 10 twists per inch, to form a yarn;
   (c) weaving the yarn into a fabric;
   (d) removing between 5 and 75 percent of the lubricant from the yarn at temperatures less than 300 degrees F.;
   (e) impregnating the fabric with a flexible resin;
   (f) curing at least partially the flexible resin; and
   (g) defining a metallic circuit on the resin impregnated fabric, whereby, a flexible printed wiring board with peel strength greater than three pounds per inch of conductor width, insulation resistance greater than $1 \times 10^9$ ohms, propagation tear strength greater than 0.5 pounds and dimensional stability greater than 2 mils per inch is fabricated.

2. The method of claim 1 wherein the ratio of polyester-to-glass surface area is greater than 1/10.

3. The method of claim 1 wherein the metallic circuit configuration is defined using an additive process.

4. The method of claim 1 wherein the metallic circuit configuration is defined using a subtractive process.

5. The method of claim 1 wherein the metallic circuit configuration is defined using a hybrid additive process.

6. The method of claim 1 wherein the epoxy resin comprises 100.0 parts by weight expoxy resin; 0-80 parts by weight antimony oxide; 0-160 parts by weight clorinated hydrocarbon; 68-95 parts by weight maleic anhydride adduct of methylcyclo-pentadiene; 69-107 parts by weight carboxy terminated butadiene-acrylonitrile; 0.5-3.0 parts by weight 2,4,6-tri(dimethylaminomethyl) phenol; and 0.1-6.0 parts by weight antioxidant.

7. The method of claim 1 wherein the epoxy resin comprises 100.0 parts by weight epoxy resin; 55.4+6.0 parts by weight antimony oxide; 110.9+11.0 parts by weight chlorinated hydrocarbon flame retardant; 86.7+5.0 parts by weight maleic anhydride adduct of methylcyclopentadiene; 90.4+3.0 carboxy terminated butadiene-acrylonitrile; 1.5+0.5 2,4,6-tri(dimethylaminomethyl) phenol; and 0.5+3.0 antioxidant.

* * * * *